June 21, 1960 W. BAAS 2,942,097
METHOD FOR MAKING BONDED CONTACTS IN SEMI-CONDUCTOR DEVICES
Filed March 25, 1958
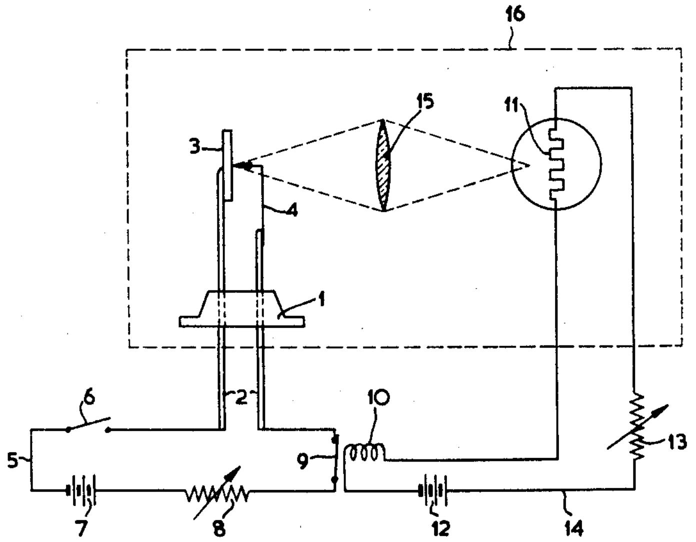
INVENTOR
WILLEM BAAS
BY Frank R. Jifari
AGENT United States Patent Office 2,942,097

Patented June 21, 1960

2,942,097

METHOD FOR MAKING BONDED CONTACTS IN SEMI-CONDUCTOR DEVICES

Willem Baas, Nijmegen, Netherlands, assignor to North American Philips Company, Inc., New York, N.Y., a corporation of Delaware Filed Mar. 25, 1958, Ser. No. 723,764

Claims priority, application Netherlands Apr. 8, 1957

4 Claims. (Cl. 219—110)

This invention relates to methods for making bonded contacts in semi-conductor devices.

One of the major problems confronting the semi-conductor device industry is mass producing large quantities of such devices exhibiting essentially the same electrical characteristics. To achieve this result, considerable effort has been expended to obtain semi-conductive bodies or wafers of the same resistivity and quality, to subject these wafers to identical cleaning and etching treatments, and to employ electrode materials whose composition is maintained within the closest possible tolerances. Despite all these precautions, it is still extremely difficult, without resorting to expensive sorting operations, to produce a large number of semi-conductor devices with reproducible characteristics.

This problem has been especially vexing in the manufacture of bonded diodes. These are diodes made with the conventional semi-conductive materials, such as germanium or silicon or the group III–V compounds, and having a pointed or wire electrode in engagement with a surface of the semi-conductive body and welded thereto by the passage of electrical current. The name "bonding" has been given to this process in this country, and an example of it is described in U.S. Patent 2,646,536. In other countries, such as Great Britain, the name "forming" has been applied to this process, and an example of that is described in British Patent 747,198. In the manufacture of such bonded diodes, it has been found that, despite the exercise of extreme care in the selection of the various elements of the assembly as well as their various treatments, variations still resulted in the electrical characteristics of the completed diode, which could be traced to the method by which the wire or electrode was bonded or welded to the semi-conductive body.

The invention is based on the discovery that there is associated with the bonding process a condition, the constancy of which ensures that the electrical characteristics possessed by the completed devices will be substantially alike, provided that one starts with reasonably uniform materials. This critical condition was found to be the temperature assumed by the wire or point electrode and the adjacent contacted region of the semi-conductive body during the bonding process. The invention resides in controlling the bonding process by this condition, and in its simplest form involves passing current through the point electrode contacting the semi-conductive body until the former attains a predetermined critical temperature, and then terminating the current flow when that temperature is reached. In a preferred embodiment of the invention, the critical temperature is determined by providing a radiation-detecting or photosensitive device located in a position to receive radiant energy generated at the junction during the bonding process and operable to terminate the said bonding process when the generated radiation attains a predetermined value.

The invention will now be described in greater detail and in connection with the accompanying drawing, of which the sole figure shows diagrammatically one form of apparatus for carrying out the method of the invention.

The usual way of making a bonded contact in a semiconductor device is first to provide a clean, etched, semiconductive wafer preferably of the single crystal type. Any of the conventional methods may be used for this purpose. The wafer may, for example, be of n-type germanium with a resistivity of, say, two ohm-centimeters. A connection is provided at one major surface of the wafer, and on the other major surface is placed a wire electrode provided with a pointed, chiseled, or flat end. Electric current is then passed through the wafer and wire electrode in an amount and for a time interval during which the wire electrode becomes bonded or welded to the semiconductive wafer. Direct currents, alternating currents or pulsed currents may be employed to effect the bond. It was found that reproducible results insofar as the electrical characteristics of the resultant devices are concerned could not be obtained even though the current, voltage and duration of the bonding process were precisely controlled and made identical. In accordance with the invention, however, the bonding process is correlated to the temperature attained at the junction of the wire or point electrode and the semi-conductive wafer during the bonding process. Thus, the bonding process is continued while that temperature is measured and until a predetermined temperature is obtained which in many cases may require different durations of the process. In view of the small dimensions of such devices, the preferred form of the invention involves detecting and measuring this temperature by means of a device actuated by radiant energy from the afore-mentioned junction. Since the wire electrode is much smaller than the wafer, most of the generated radiant energy will emanate from its tip or point. Hence, the temperature acutally measured in the preferred form of the invention is that of the wire or point electrode itself.

Referring now to the drawing, there is shown part of a semi-conductor device ultimately to be made into a so-called "gold-bonded" diode. While the invention will be described in connection with such a device, it will be appreciated that it is equally useful in any type of diode or transistor or other semi-conductor device wherein it is desired to make contact by means of a wire or the like to a semi-conductive body by the passage of electrical current therethrough or like heat-producing methods. In most cases, the resultant contact will be of the rectifying type, as this type of contact plays such an important role in determining the ultimate electrical characteristics of the completed device. The incomplete diode shown comprises a head 1, for example of glass, through which is sealed two lead-in conductors 2. The end of the lead 2 on the left is soldered, for example with tin solder, to and supports a semi-conductive body or wafer 3, for example of the n-type germanium crystal referred to above, and makes an ohmic contact thereto. To the lead 2 on the right is secured a whisker or thin wire 4 to be bonded to the opposite, major surface of the semi-conductive body 3. The whisker 4 is preferably of gold and may be doped with a p-type conductivity-determining impurity, such as gallium. A typical alloy for the wire or whisker 4 comprises 99% gold and 1% gallium. The end of the whisker contacting the semi-conductive wafer 3 may be pointed. To the two leads 2 are connected a bonded-contact-forming circuit comprising an on-off switch 6, a suitable current source 7, a variable, limiting resistor 8 and the normally-closed contact 9 of a relay 10. When the switch 6 is closed, D.C. current limited by the resistor 8 passes through the junction of the whisker 4 and semi-conductive body 3 causing it to heat up and, as described in the afore-mentioned British patent, melt the contacting portions to form an alloy or weld therebetween. The junction of these two members and especially the whisker 4 will thus attain some elevated temperature and generate radiant energy. The radiated energy is, of course, proportional to the temperature of the radiating element, and can be detected and measured by a suitable photo-sensitive device positioned near the semi-conductive wafer.

A typical photo-sensitive device 11 is shown in the drawing, and may comprise a photo-conductive material, such as cadmium sulphide, positioned to receive the radiant energy from the whisker and whose resistance is a function of the received energy. Other photo-sensitive or radiation-detecting devices which will respond to the radiant energy from a heated body can of course be used in place of this photoconductive device. The photo-sensitive device 11 is connected in a measuring circuit 14 comprising the energizing coil of the relay 10, another suitable source of current 12, and a variable resistance 13. As will be obvious, when the radiation attains a certain predetermined value, controllable by the resistor 13, the resistance of the photo-sensitive device 11 is reduced to a point wherein sufficient current flows in the measuring circuit 14 to actuate the relay 10 and thus interrupt the bonding circuit 5, thereupon terminating the bonding current and bonding process.

As has been described, the bonding process has been correlated to the temperature assumed by the junction between the wire and the semi-conductive wafer or that of the wire alone while current is passed therethrough. It will be thus appreciated that depending upon the care with which the various elements of the device are prepared, and especially the contact resistance and pressure, it is possible for the bonding process to require different times for different devices, as different times may be required before the same junction or whisker temperature is attained. For the ordinary gold-bonded diodes of the small-signal type, well-known in the prior art, the temperature assumed by the whisker just before termination of the bonding process is of the order of 800° C. However, the absolute value of this temperature is not significant. What the method of the invention ensures is that each bonded contact made thereby will have attained the same temperature, whatever that may be, in order to obtain the same electrical characteristics desired. Hence, in carrying out the invention, some experimentation may be necessary to determine the optimum temperature required to produce the characteristics desired. Thus, for example, several diodes can be manufactured each time varying in finite amounts the value of the resistor 13 or the resistor 8. In this way, the point contact 4 can be made to assume different temperatures. After these devices have been completed, which usually will involve sealing the header-supported wafer and whisker into a suitable cap or can, its electrical characteristics may be tested to determine whether or not they possess the required values. The device that is found satisfactory determines the values of the resistors 8 and 13 for the manufacture of all succeeding devices. By the method of the invention, it is ensured that, in all succeeding devices, the bonded contacts assume precisely the same temperature as that of the device whose characteristics were found to be satisfactory, and as was discovered, if the first possessed the required characteristics, so would all succeeding ones. The desired results of producing reproducible devices is thus readily attained with a simple apparatus.

Referring back to the drawing, there is also shown an optical system 15 which may be used to focus the radiation from the heated whisker 4 onto the photo-sensitive device 11 in order to improve its collection efficiency. Further, as the photo-sensitive device 11 may also be sensitive to ordinary, visible light, the method is preferably carried out in a darkened enclosure, which has been indicated diagrammaticaly by the broken line 16.

It is also possible to use the method and apparatus of the invention in the manufacture of transistors having two wire or point electrodes. This may be done by providing an optical system associated with each electrode for directing the radiation generated thereby during the bonding process to a separate photo-sensitive device, each in turn controlling the bonding circuit of their respective electrode. In this way, a plurality of electrodes can be bonded simultaneously. However, the electrodes may be too close to one another thus making it difficult to separate the radiant energy generated at each junction. In the latter case, the electrodes can obviously be bonded in succession, in which case a single, photo-sensitive device may be employed to successively determine the temperatures of the plural electrodes.

While the invention has been described in connection with specific embodiments and applications, other modifications thereof will be readily apparent to those skilled in this art without departing from the spirit and scope of the invention as defined in the appended claims.

What is claimed is:

1. In the method of making a rectifying bonded electrode contact between a metal point electrode and a semi-conductive body selected from the group consisting of germanium, silicon and group III–V compounds in the manufacture of plural semi-conductor devices, the steps comprising passing heating current through the contacting electrode and body of each device sufficient to bond them together, determining the temperature at the region of the junction of the contacting electrode and body, which is indicative of the resultant electrical characteristics of the device, and terminating the heating current when the said region of each device attains the same predetermined temperaure, whereby said devices tend to exhibit similar electrical characteristics.

2. A method as set forth in claim 1 wherein the temperature is determined by detecting and measuring the radiant energy generated at the region of the heated junction.

3. A method as set forth in claim 2 wherein the temperature is determined by measuring with a photo-sensitive device the radiant energy generated by the tip of the point electrode, the output from said photo-sensitive device being utilized to terminate the heating current when the generated radiant energy attains a predetermined value.

4. In the method of making a rectifying bonded electrode contact between a gold-containing point electrode and a semi-conductive body selected from the group consisting of germanium, silicon and group III–V compounds in the manufacture of plural semi-conductor devices, the steps comprising passing heating current through the contacting electrode and body of each device sufficient to bond them together, measuring the temperature at the region of the junction of the contacting electrode and body, which is indicative of the resultant electrical characteristics of the device, by detecting and measuring with a photo-conductive element the radiant energy generated at the region of the heated junction, and utilizing said photo-conductive element to automatically terminate the heating current when the said region of each device generates a predetermined value of radiant energy and thus attains the same predetermined temperature, whereby said devices tend to exhibit similar electrical characteristics.

References Cited in the file of this patent

UNITED STATES PATENTS

| | | |
|---|---|---|
| 2,233,617 | Lamb | Mar. 4, 1941 |
| 2,646,536 | Benzer et al. | July 21, 1953 |
| 2,704,818 | North | Mar. 22, 1955 |